(12) United States Patent
Maeritz

(10) Patent No.: US 6,909,933 B2
(45) Date of Patent: Jun. 21, 2005

(54) METHOD, DEVICE, COMPUTER-READABLE MEMORY AND COMPUTER PROGRAM ELEMENT FOR THE COMPUTER-AIDED MONITORING AND CONTROLLING OF A MANUFACTURING PROCESS

(75) Inventor: Jörn Maeritz, Zeiler/Nittendorf (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/706,615

(22) Filed: Nov. 12, 2003

(65) Prior Publication Data

US 2004/0225396 A1 Nov. 11, 2004

(30) Foreign Application Priority Data

Nov. 12, 2002 (DE) .......................... 102 52 605

(51) Int. Cl.[7] .............................. G06F 19/00
(52) U.S. Cl. ................... 700/121; 700/109; 702/179
(58) Field of Search ................ 700/121, 95, 108–110, 700/117, 51; 702/179–181, 182–183, 185; 716/4

(56) References Cited

U.S. PATENT DOCUMENTS

| | | | | |
|---|---|---|---|---|
| 5,926,690 A | * | 7/1999 | Toprac et al. ................. | 438/17 |
| 6,161,054 A | * | 12/2000 | Rosenthal et al. .......... | 700/121 |
| 6,263,255 B1 | | 7/2001 | Tan et al. | |
| 6,405,096 B1 | * | 6/2002 | Toprac et al. ................ | 700/121 |
| 6,442,499 B1 | * | 8/2002 | Gorin .......................... | 702/120 |
| 6,477,432 B1 | * | 11/2002 | Chen et al. .................... | 700/51 |
| 6,556,884 B1 | * | 4/2003 | Miller et al. ................. | 700/121 |
| 6,560,503 B1 | * | 5/2003 | Toprac et al. ................ | 700/108 |

FOREIGN PATENT DOCUMENTS

GB     2 347 522 A     9/2000

* cited by examiner

Primary Examiner—Leo Picard
Assistant Examiner—Zoila Cabrera
(74) Attorney, Agent, or Firm—Brinks Hofer Gilson & Lione

(57) ABSTRACT

In the case of a method for the computer-aided monitoring and controlling of a manufacturing process of a plurality of physical objects, the physical objects are subjected to at least one manufacturing step and at least one of the processed physical objects is marked according to a deterministic selection criterion in such a way that it can be subjected to a test measurement. Furthermore, the manufacturing process is controlled on the basis of the result of the test measurement of the marked object.

5 Claims, 3 Drawing Sheets

METHOD, DEVICE, COMPUTER-READABLE MEMORY AND COMPUTER PROGRAM ELEMENT FOR THE COMPUTER-AIDED MONITORING AND CONTROLLING OF A MANUFACTURING PROCESS

FIELD OF THE INVENTION

The invention relates to a method, a device, a computer-readable memory and a computer program element for the monitoring and controlling of a manufacturing process.

BACKGROUND OF THE INVENTION

In the manufacture of highly integrated semiconductor chips on wafers, the ever-increasing miniaturization of the structures on the semiconductor chip is responsible in particular for imposing ever greater requirements on the production installations and manufacturing processes used for the manufacture of the semiconductor chips. The stability and reproducibility both of the production installations and of the manufacturing processes decisively influence the yield and productivity during semiconductor chip production. Even small deviations from a prescribed form of behavior of a wafer production installation during production can lead to considerable worsening of the yield (i.e. a considerable increase in the defect rate of the semiconductor chips manufactured).

In general, the semiconductor chips are manufactured several at a time on wafers. Furthermore, in the manufacturing process a number of identical wafers are grouped into a logistical unit, a lot, and subjected together to semiconductor process steps.

For completely and exactly determining the product quality of the wafers of a lot or of the process for manufacturing these wafers, all the semiconductor chips would have to be subjected to test measurements after they have been completed to determine their properties and quality. However, this would require much too great an expenditure in terms of time and cost. Therefore, the Statistical Process Control (SPC) method is used for determining the quality of the manufactured semiconductor chips according to the prior art, arranged on the wafers. In the SPC method, a random sample of wafers is statistically selected from the lot of wafers and then test measurements are performed on them for determining the quality of the wafers. On the basis of the results of this test measurement, the quality of the wafers of the entire lot is concluded. It is assumed that the quality of all the wafers of the lot will then fluctuate about the measured quality values. The quality values determined in this way are used both for the determination of the cp value, which is a statement of the range of a distribution of the measured values, or in other words a measure of the smallest possible proportion of defective units (wafers) in the process that is expected when the position of the distribution is centred, and for the determination of the cpk value, which is a value which indicates how centrally the distribution of the measured values lies in relation to a prescribed specification, or in other words a measure of the expected proportion of defective units in the process.

A major aspect in the manufacture of semiconductor chips is also to detect possible deviations from a prescribed form of behavior in a chip production installation or during a manufacturing process at an early time and to take corresponding countermeasures. Consequently, the analysis and monitoring of machines, in particular of the chip production installations, and of the manufacturing processes takes on very great commercial significance. Furthermore, the analysis and monitoring of many process steps of the manufacturing process is of considerable significance, since it is usually only rarely possible to repair an intermediate product after a process step has been carried out. A functional test of a manufactured semiconductor chip is generally not provided within the SPC method until at the end of the manufacturing process, which leads to feedback of the results obtained into the manufacturing process only being possible very late. Measurements at the end of the manufacturing process also lead to unspecific results in the sense that possibly poor production quality of the wafer cannot necessarily be attributed to a specific processing step.

It is further known to perform inline measurements of interim process results, inline SPC measurements, for example of the layer thicknesses, the layer resistance or of line widths, etc., by means of the SPC method. This leads to additional measuring steps in the overall manufacturing process and is consequently time-consuming and costly, but increases the extent to which possible deficiencies in quality can be assigned to a specific processing step.

Furthermore, a method for improving the manufacturing process by means of continuous adaptations to the needs and established deficiencies of the wafers manufactured, the run-to-run method, is known. When the run-to-run method is used, the manufacturing process is constantly and continually ("from run to run") controlled on the basis of measured process results (i.e. measurements on the products or intermediate products manufactured). Process parameters of a processing step are controlled on the basis of measured product results at short time intervals. The controlling by means of the run-to-run method is carried out by means of so-called run-to-run controllers.

However, to carry out the run-to-run method, measurements on wafers are necessary, in order to determine their product quality and control the process parameters in response to that. Since, as already mentioned, measurements for determining the product quality are both time-intensive and cost-intensive, the inline SPC measurements on randomly selected wafers are used as input variables for the control by means of the run-to-run method. These inline SPC measurements are used to provide the required indications of the product qualities, on the basis of which the run-to-run method can control the further production process.

GB 2,347,522 discloses a method and apparatus for the process control of semiconductor fabrication, in which a lot-based management computer performs management of wafers with a lot as a unit by managing a process condition for each lot.

U.S. Pat. No. 6,263,255 discloses an Advanced Process Control (APC) Framework, which automatically carries out process control operations through the design and development of a software framework that integrates factory, process and equipment control system.

SUMMARY OF THE INVENTION

The object of the present invention is to ensure or enhance the functional capability of run-to-run controllers and to increase the cp values and cpk values.

In the case of a method for the computer-aided monitoring and controlling of a manufacturing process of a plurality of physical objects, the physical objects are subjected to at least one manufacturing step and at least one of the processed physical objects is marked according to a deterministic selection criterion in such a way that it can be subjected to a test measurement. Furthermore, the manufacturing process is controlled on the basis of the result of the test measurement of the marked object.

The device for the monitoring and controlling of a manufacturing process of a physical object has at least one processor, which is set up in such a way that the method steps described above can be carried out.

In a computer-readable storage medium, a processing program for the monitoring and controlling of a manufacturing process of a physical object is stored, which processing program has the method steps described above when it is run by a processor.

A computer program element for the monitoring and controlling of a manufacturing process of a physical object has the method steps described above when it is run by a processor.

The invention can be realized both by means of a computer program, i.e. software, and by means of one or more special electrical circuits, i.e. in hardware, or in any desired hybrid form, i.e. by means of software components and hardware components.

A chip production installation is to be understood in the description as meaning a system or an arrangement in which semiconductor components, in particular semiconductor chips, are produced by using different raw materials, for example by using semiconductor materials such as silicon or else other main group IV semiconductor materials (for example germanium) or binary, ternary or else quaternary III–V compound semiconductor materials (for example indium-gallium-arsenide-phosphide, indium-gallium-arsenide-antimonide, etc.), or binary, ternary or else quaternary II–VI compound semiconductor materials.

A semiconductor chip is to be understood in this description as meaning for example a memory chip, a microprocessor chip, a communication chip, a chip with an integrated semiconductor laser element, and also a chip optimized to a hardware function which can be predetermined as desired, such as for example a communication chip for the decoding of received radio signals or a chip for the processing of video signals.

The chip production installation has a number of production sub-installations, for example different machines, with which the physical or chemical process steps necessary for the overall manufacturing process of a chip can be carried out.

An example in particular in the front-end area of chip production is that of devices for carrying out the following process steps:

a Rapid Thermal Processing Device (RTP device),
a furnace for heating up the wafers to be processed,
an etching device, for example a plasma-etching device, or a dry-etching device,
a lithographic device,
a wet-treatment device for etching, resist removal, cleaning or altering the product surface,
a CMP device, i.e. a device for carrying out chemical-mechanical polishing,
an ion-implantation device,
a depositing device for depositing layers on the wafer, for example a depositing device for Physical Vapor Deposition (PVD) or Chemical Vapor Deposition (CVD),
a measuring device for measuring predetermined wafer parameters or process parameters,
a testing device for testing wafers manufactured.

Depending on the product respectively to be manufactured, for example depending on the desired configuration of the chip to be produced, a multiplicity of different devices, that is to say production sub-installations, are provided in the chip production installation and coupled to one another to realize the respective necessary overall semiconductor chip production process.

It should be noted in this connection that the sequence of the individual process steps in the respective production sub-installations can either be carried out "sequentially", i.e. always first in a first installation group A (for example resist coating) before a second installation group B (for example exposure) for two manufacturing steps which are to take place one after the other, or can be carried out "in parallel", i.e. in a first installation B1 (for example Scanner type XY100) or a second installation B2 (for example Stepper type Extra2000) for two different installations and processes which can alternatively carry out one and the same manufacturing step.

By means of the invention it is possible to ensure the functional capability of controllers which control a manufacturing process. Since the physical objects on which test measurements are carried out are not randomly selected, as they are according to the prior art, but are selected by means of deterministic rules, i.e. rules which are precisely not random, it cannot occur, for example, that lots which have to be subjected to a test measurement since control of a subsequent process step is to be performed on the basis of these lots are not measured. It is consequently no longer possible for an algorithm which is used for controlling the manufacturing process to fail on account of missing or inadequate results of test measurements. The use of deterministic rules which take into account SPC measurements of a manufacturing process and selection criteria of the control of the manufacturing process ensures that the optimum of lots or wafers is measured. Only the minimum number of measurements required for correct monitoring and control of the manufacturing process are carried out. The method may be a run-to-run method. The physical object is preferably a wafer.

The invention is well-suited in particular in the case of wafer manufacture with its extremely high number of process steps and very high requirements on the quality of production, since an improved automated quality control and control of the manufacturing process is realized in a simple way. Furthermore, there is no risk of control of the manufacturing process being interrupted due to missing measurements on wafers or lots of wafers, while at the same time the manufacturing process is not slowed down by unnecessary SPC measurements.

In a development, the test measurement is an inline SPC measurement. In a refinement, the deterministic selection criterion is determined by means of rules. Preferably, at least one wafer necessary both for the run-to-run method and for the inline SPC method is selected.

By means of the invention it is possible to integrate criteria of a method for controlling a manufacturing process, preferably a run-to-run method, into the standard production sequence. By contrast with the prior art, in which the sampling (i.e. the selection of the plurality of physical objects, is carried out independently of criteria of the method for controlling the manufacturing process), in the method according to the invention the sampling, in particular of wafers, is carried out on the basis of criteria which satisfy not only the criteria of the standard production sequence (i.e. preferably of the inline SPC method, but also the criteria for a method for controlling the manufacturing process). By this integration it is also ensured that run-to-run control loops, i.e. control loops which are controlled by the run-to-run method, operate uninterruptedly. This is so because, according to the prior art, it can happen that the run-to-run method fails, since for example a lot is not measured in a feedforward loop, i.e. a control loop in which a subsequent processing step is controlled on the basis of a result of a measurement, and consequently the measured value required for the controlling is not available. In a method according to the prior art, this missing value may lead to a failure of the run-to-run method in the subsequent process. By contrast, according to the invention it is ensured by means of the deterministic selection criteria that the values required for control are always available to the method for controlling the manufacturing process.

The invention can clearly be seen in creating an automated selection of random samples by means of methodical application of rules. The rules ensure that the lots, and wafers, necessary for a quality measuring method (preferably an SPC method) and a method for controlling the manufacturing process (preferably a run-to-run method) are always measured, in order to obtain the measurement data required for the quality monitoring and the control of the manufacturing process. Furthermore, controller loops, i.e. control loops by means of which the manufacturing process is controlled, of the run-to-run method are not interrupted or a supplied inadequately with data, and at the same time the best-suited lots/wafers are measured.

In addition, it is possible to adapt the measuring sequence, i.e. the sequence in which the individual lots/wafers are measured in test measurements, to the requirements of the run-to-run method. As a result, so-called overcontrol of the manufacturing process cannot occur. This overcontrol can happen if the measuring sequence is not maintained within the lots. In other words, there are wafers awaiting measurement from two lots which were processed one after the other. The wafers of the second lot are measured first, which can happen within an SPC method according to the prior art. The results of the test measurements on wafers of the second lot are then used as a basis for controlling the previous process step. When wafers of the first lot are then subsequently measured, these were manufactured with old settings of the manufacturing process for which changes could not have occurred on the basis of the control provided by the results of the measurements on the second lot. Consequently, no changes in the results of the test measurements can have occurred on the basis of the parameter changes. The run-to-run control expects, however, the effects of the control to have already occurred, since the control has already been carried out. Accordingly, a second control is carried out. Overcontrol of the process is the result.

According to the invention, it is ensured that a series of lots of a group to be measured run-to-run are measured in the sequence of their processing time.

A further condition which can be maintained by means of a deterministic selection criterion is that the lots to be sampled are provided on the basis of criteria which are optimized according to SPC and run-to-run criteria. One possibility for optimization is, for example, a criterion that no measurement is to be performed on the lot from a series of lots with high cp values that comes from a mold which has not produced the corresponding product for a long time, and consequently the run-to-run controller has not been updated for quite a long time, i.e. results of test measurements passed to the run-to-run controller in order for it to control the manufacturing process according to the results of the test measurement. It is in this way ensured that the control updates the settings of the process parameters to a sufficient extent.

By means of the optimization of the selection criteria, on the one hand the functional capability of the run-to-run controllers is ensured and improved and at the same time the cp and cpk values of the manufacturing process are improved.

Even though the invention is explained in more detail below on the basis of the example of a monitoring method of a wafer manufacturing process, it is pointed out that the invention is not restricted to this but instead can be used in all monitoring methods for manufacturing processes in which process parameters are recorded in the manufacturing process for manufacturing a physical object, for example also in the pharmaceuticals industry in the manufacture of pharmaceutical products.

BRIEF DESCRIPTION OF THE DRAWINGS

An exemplary embodiment of the invention is explained in more detail below and represented in the figures, in which.

DETAILED DESCRIPTION OF THE INVENTION

Figure 1:
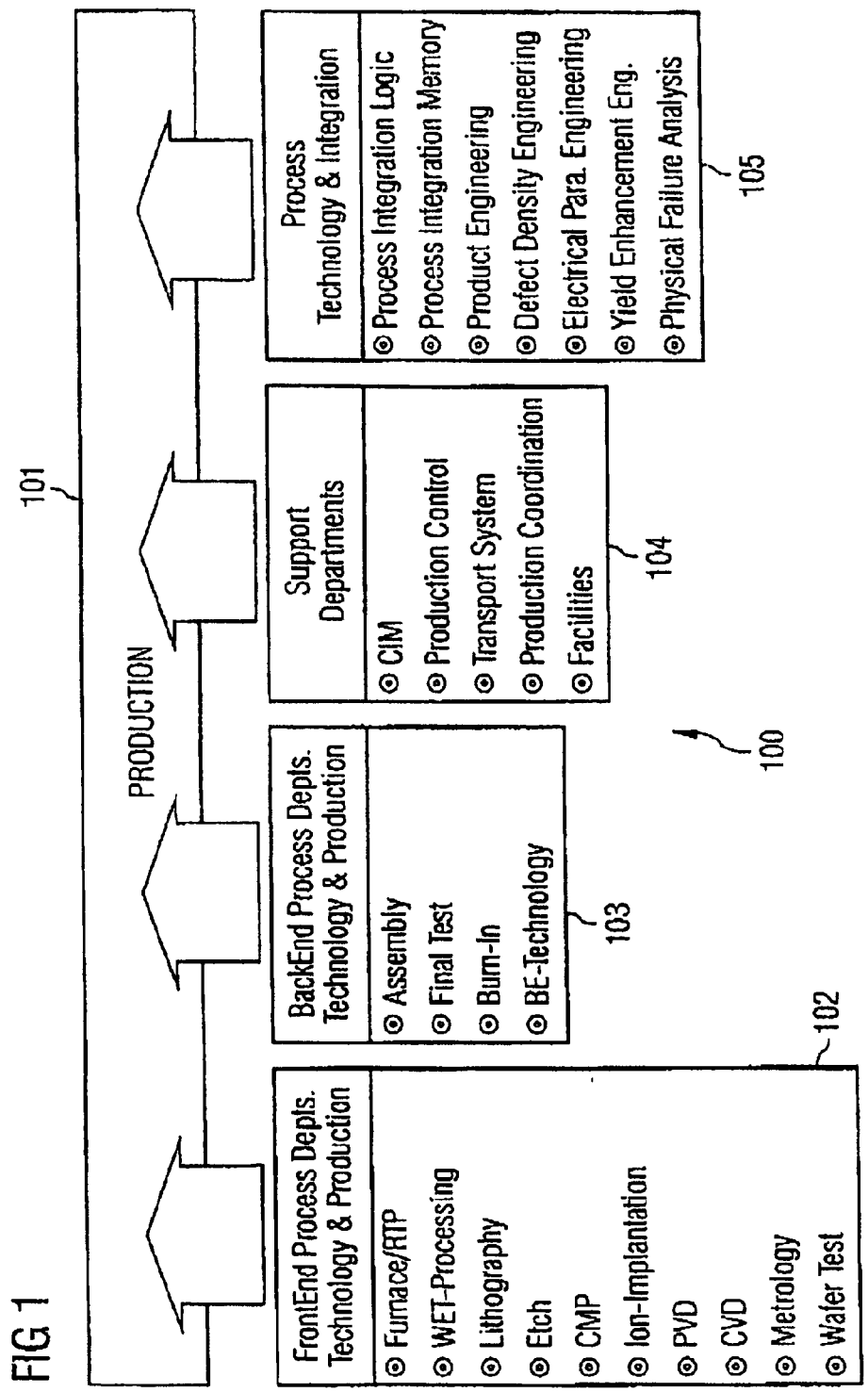
FIG. 1 shows a block diagram in which the general organization of a chip production installation is represented.

By way of introduction, FIG. 1 schematically illustrates in a block diagram 100 the organization and setup of a semiconductor chip production installation, for which a method according to the invention can be used for the monitoring of a manufacturing process of a plurality of wafers.

The overall manufacturing process, referred to in FIG. 1 by a first block 101, is grouped by way of example into four production areas 102, 103, 104, 105, a first area, into which the front-end processes of the chip production are grouped (block 102), a second area of the manufacturing process, into which the back-end processes are grouped (block 103), a third area of the manufacturing process, which relates to the support, that is to say the backup, of the individual manufacturing processes (block 104), a fourth area, which relates to the process technology and the process integration (block 105).

In the case of the front-end processes 102, the following process technologies and the devices set up for carrying out the corresponding processes are provided in particular:

a furnace for heating up the respective wafer to be processed;

a device for carrying out Rapid Thermal Processing (RTP);

a device for etching the wafer, for example for wet-etching or for dry-etching;

a device for cleaning, for example washing, the wafer;

a device for carrying out various lithographic steps;

a device for chemical-mechanical polishing (CMP);

a device for carrying out an ion-implantation in predetermined areas of the wafer or of the chip respectively to be produced;

devices for applying materials to the wafer, for example devices for depositing materials from the vapor phase, that is for example devices for carrying out Physical Vapor Deposition (PVD) or Chemical Vapor Deposition (CVD), or a device for epitaxially growing material on a substrate;

metrology devices, i.e. measuring devices; and devices for carrying out tests on the respective wafers.

The back-end processes relate in particular to the following areas:

the assembly of the chips in packages;

the final test of the finished and packaged chip;

the introduction of information, for example product information, into or onto the package of the respective chip; and also generally the technologies used in the back-end area for packaged and unpackaged chips.

The support, that is to say the process backup, relates in particular to the following areas:

CIM;

process monitoring;

a transportation system for delivering the finished semiconductor chips;

coordination of production; and backup for the respective production sites.

Process technology and process integration relates in particular to the process integration of logic chips;

the process integration of memory chips;

product engineering;

the monitoring and improving of defect densities in manufacture;

the monitoring of electrical parameters in the products manufactured;

enhancement of the yield of the chips manufactured; and a physical failure analysis.

Figure 2:
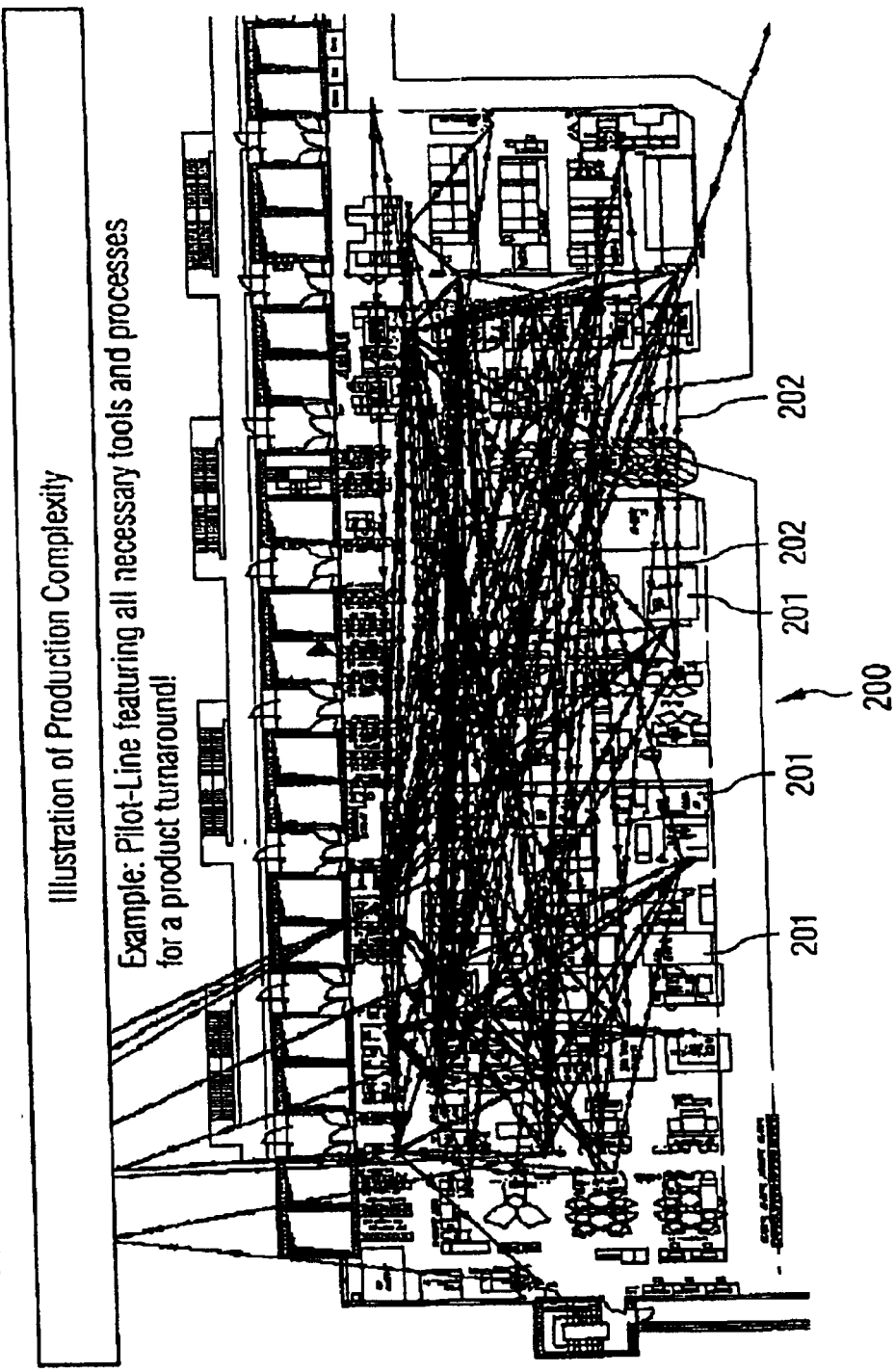
FIG. 2 shows a diagram of a chip production installation, with the complex material flow, i.e. the path of a wafer/lot, through the chip production installation and the associated complex process steps being represented.

FIG. 2 shows a semiconductor chip production installation, in other words a semiconductor chip factory 200, with a multiplicity of semiconductor chip production sub-installations 201, which are used for processing raw materials, for example a silicon wafer or a wafer made of other semiconductor materials (germanium, gallium-arsenide, indium-phosphide, etc.), in order to produce semiconductor chips from the raw materials.

A customary manufacturing process for manufacturing a semiconductor chip has hundreds of different process steps, in which lithographic steps, etching steps, CMP steps, steps for applying materials to the respective wafer to be processed, or else steps for doping or implanting doping atoms in the wafer to be processed are carried out in various sequences. In the case of all these process steps, values of process parameters are recorded and can be subjected to a later statistical analysis.

This results in the paths represented in FIG. 2 by lines 202, which represent the path of a wafer or lot through the semiconductor chip production installation 200. In the semiconductor chip production installation 200 there are a multiplicity of sensors, which are assigned to the respective production sub-installations 201 and an even greater amount of process data (raw data), which are respectively acquired by the sensors and, as explained in more detail later, processed, are recorded. A respective sensor may be integrated into a respective machine (integrated sensor) or be attached separately to a respective machine (external sensor). Hereafter, the production sub-installations 201 are also referred to as machines 201.

Figure 3:
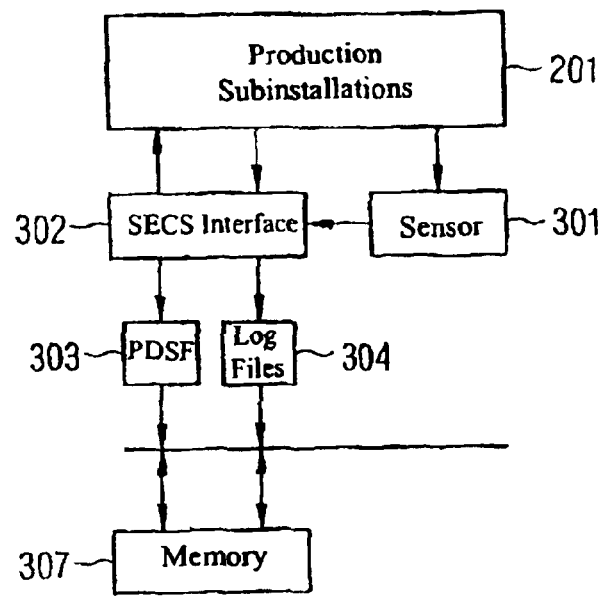
FIG. 3 shows a block diagram in which the process data flow when manufacturing a wafer/lot is represented.

FIG. 3 shows by way of example the data flow for process data, which are acquired on a machine 201 by means of an integrated sensor or by means of an external sensor 301. Each sensor 301, it being possible for any desired number of integrated and/or external sensors to be provided, acquires the parameters of the machine 201 which are respectively predetermined for it, for example physical or chemical states in a process chamber, the position of a robot arm, etc. Examples of process parameters in the manufacture of a wafer are the misalignment (i.e. the positioning inaccuracy) within a positioning step, the temperature during a process step, the gas flow during a process step, the time duration of a process step or the pressure during a process step.

The sensor 301 is coupled via an SECS interface 302, which is set up for data communication according to the SECS standards, to a local communication network (Local Area Network, LAN) 306.

According to the SECS standards, files are generated by the sensor 301 and the SECS interface 302 according to the PDSF format (Process Data Standard Format), also referred to hereafter as PDSF files 303 and also log files 304, the PDSF files 303 and the log files 304 being stored as data in a memory 307.

The PDSF files 303 contain, for example, analog data from different channels, that is to say from different internal (i.e. integrated) and/or external sensors 301, which may be attached to a machine 201. The process data generated are stored in the memory 307.

Figure 4:
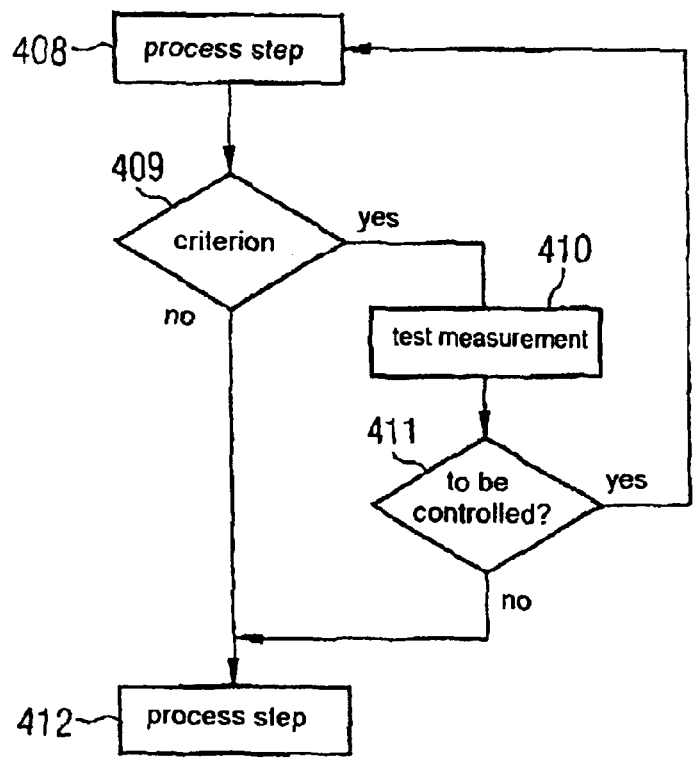
FIG. 4 shows a schematic schedule of a method according to the invention.

Following representation of a schematic overview of a manufacturing process of a wafer and processing of measured process parameters in FIGS. 1 to 3, a schematic schedule of a method for the monitoring and controlling of such a manufacturing process according to an exemplary embodiment of the invention is then given in FIG. 4.

The monitoring and controlling of the manufacturing process is preferably carried out by means of a control computer. By means of this control computer, the control of the individual process steps (i.e. the process parameters of the individual process steps) is carried out in particular. Furthermore, by means of the control computer, the selection of the samples which are to be subjected to a test measurement is also made according to deterministic selection criteria.

In a processing step 408 of the manufacturing process described above, which is controlled by means of the method according to the invention, a plurality of intermediate products of a wafer manufacturing process are created. The plurality of wafers are logistically combined in the manufacturing process to form a lot. All the wafers which belong to a lot are manufactured by means of the same processing steps on the same machines, etc. They consequently have an identical manufacturing history. This manufacturing history is also reflected in the process data stored in the memory 307. Under some circumstances it is also possible for identical intermediate products (semifinished wafers) to have a different manufacturing history. For example, a processing step may be carried out on different machines, and consequently an identical intermediate product can be produced with different manufacturing histories.

According to the invention, the sequence of the individual wafers within a lot is then fixed or recorded and also the sequence of individual lots among one another is fixed or recorded.

If the processing step 408 is to be controlled on the basis of these lots, it is necessary to select a random sample of wafers and/or lots of wafers, which is subjected to a test measurement for establishing the quality of the manufacturing step. This selection takes place according to the invention by means of deterministic selection criteria, which on the one hand satisfy the needs of a conventional inline SPC method, which are generally simply a prescribed number of wafers from the lot. On the other hand, the random sample selected according to deterministic selection criteria also takes into account the necessity of the method for controlling the manufacturing process, of a run-to-run method.

If a lot/wafer satisfies the selection criteria for the random sample selection in the step 409, the corresponding lot is provided for test measurements. Selection criteria may be, for example, that the lot concerned has already been used for controlling a previous process step, and the control of the subsequent process step 408 is coupled with the control of the preceding processing step. A further selection criterion may be that the wafers of the lot concerned were manufactured on a machine or mold which had not been controlled by the control method for quite a long time. Subsequently, the test measurements which are required for the control of the manufacturing process are carried out in step 410. These test measurements which are necessary for the control method (run-to-run method) can be used at the same time as measurements for the inline SPC method, since according to the invention the respective selection criteria both of the inline SPC method and the selection criteria of the run-to-run method are taken into account in the case of the selection criteria for the random sample.

According to the invention, the sequence of the lots or the individual wafers within a lot is also taken into account. Consequently, so-called overcontrol of the manufacturing process cannot occur. Overcontrol can happen if two lots of wafers are measured in a test measurement in the reverse sequence of their processing. If a later lot or wafer of this later lot is measured first in the run-to-run method, and the previous processing step is controlled on the basis of the results of these measurements, this control cannot have any effect on a previously processed lot of wafers. Since, however, the lot actually processed earlier is not measured until after the lot processed later in the test measurement for the run-to-run method, a renewed control is carried out, because the run-to-run method assumes in the evaluation of the results of the test measurements that the control for the production of this lot had already been carried out. The evaluation consequently gives rise to a further control requirement for the manufacturing step. Overcontrol of the process is the result. In order to prevent such overcontrol, according to the invention the process sequence and the measuring sequence of the individual lots are followed.

Following the test measurement, an evaluation unit 411 of the run-to-run method analyses the results of the test measurements on the basis of prescribed criteria, for example limit values or product qualities, which have to be maintained, as to whether or not a control of the process step 408 is necessary. In the case that control is necessary, this control is carried out for the process step 408, i.e. process parameters of the processing step are generally altered.

Once the test measurements have been completed, the wafers or the lot with the plurality of wafers which were subjected to the test measurements is/are in turn integrated into the normal manufacturing process. If, however, the results and the evaluation of these results show that possibly set limit values for product qualities are not maintained, these wafers or the lot of wafers may, however, also be subjected to the steps which the inline SPC method prescribes for such a case. For example, these wafers or the lot of wafers may be removed from the conventional manufacturing process, or be subjected to re-working.

If in the step 409 a lot is not selected as a sample which is to be used for test measurements, it remains in the normal manufacturing process and is further processed by means of a next processing step 412.

To sum up, the invention provides a method which combines the selection criteria for the selection of a sample of lots of wafers or wafers and the selection criteria of an inline SPC method and a run-to-run method which controls a manufacturing process of a physical object. By means of these combined selection criteria, the necessities both of the inline SPC method and of the run-to-run method are satisfied by means of a minimal number of test measurements to be carried out. The number of measurements is reduced, since redundant measurements are avoided. It is also ensured by means of the method according to the invention that all the measurements which have to be carried out on a wafer or lot of wafers to obtain all the measured values required for the run-to-run method are carried out. It is further ensured according to the invention that the individual lots of wafers are not dealt with in the reverse sequence in the processing of the test measurement, i.e. the sequence of the processing and the sequence in which possible test measurements are carried out is the same. As a result, so-called overcontrol of the manufacturing process cannot occur. It is also ensured by the deterministic selection criteria that missing values, i.e. results of test measurements, do not cause failure of the run-to-run method, or of the algorithms by means of which the run-to-run method is carried out.

The invention includes the provision of an integral Advanced Process Control (APC), i.e. an overriding set of rules which combines a method for controlling a manufacturing process of a physical object, for example a run-to-run method, and a method of production, for example an SPC method, which determines sampling or lot selection for test measurements for determining the quality of production. Furthermore, by means of incorporating the rules of the set of rules in a computer-aided method for the monitoring and controlling of the manufacturing process, flexible and automatic processing is ensured and it is ensured that both the method for controlling a manufacturing process and the method of production can be carried out and also adapted.

What is claimed is:

1. A run-to-run method for the computer-aided monitoring and controlling of a manufacturing process of a plurality of wafers, the method comprising the step of:

subjecting a plurality of wafers to at least one manufacturing step;

marking at least one of the processed wafers according to a deterministic selection criterion based on requirements of the run-to-run method and an inline SPC method, in such a way that the at least one marked wafer it can be subjected to an inline SPC measurement;

controlling the manufacturing process on the basis of the result of the inline SPC measurement of the wafer; and selecting at least one wafer necessary for the run-to-run method and also for the inline SPC method according to the deterministic selection criterion.

2. The method as claimed in claim 1, in which the deterministic selection criterion is determined by means of rules.

3. A device for the monitoring and controlling of a manufacturing process of a plurality of wafers, the device comprising:

a processor which is set up to run steps of a run-to-run method;

an element for carrying out at least one manufacturing step on the plurality of wafers;

an element for marking at least one of the plurality of wafers according to a deterministic selection criterion based on the run-to-run method and an inline SPC method, in such a way that the at least one marked wafer can be subjected to an inline SPC measurement, and selecting at least one wafer for the run-to-run method and the inline SPC method according to the deterministic selection criterion; and an element for controlling the manufacturing process based on the result of the inline SPC measurement.

4. A computer-readable storage medium, in which a program for the monitoring and controlling of a manufacturing process of a plurality of wafers is stored, the monitoring and controlling being carried out by means of a run-to-run method, the program executing method steps when it is run by a processor, the computer-readable storage medium comprising:

a code for carrying out at least one manufacturing step on the wafers;

a code for marking at least one of the processed wafers according to a deterministic selection criterion based on the run-to-run method and an inline SPC method, in such a way that the at least one marked wafer can be subjected to an inline SPC measurement;

a code for selecting at least one wafer for the run-to-run method and the inline SPC method according to the deterministic selection criterion; and a code for controlling the manufacturing process based on the result of the inline SPC measurement.

5. A program element for the monitoring and controlling of a manufacturing process of a plurality of wafers, the monitoring and controlling being carried out by means of a run-to-run method, the program element executing method steps when it is run by a processor, the program comprising:

code for carrying out at least one manufacturing step on the wafers;

code for marking at least one of the processed wafers according to a deterministic selection criterion based on the run-to-run method and an inline SPC method, in such a way that the at least one marked wafer can be subjected to an inline SPC measurement;

code for selecting at least one wafer for the run-to-run method and the inline SPC method according to the deterministic selection criterion; and code for controlling the manufacturing process based on the result of the inline SPC measurement.

* * * * *